(12) United States Patent
Sun et al.

(10) Patent No.: US 12,464,754 B2
(45) Date of Patent: Nov. 4, 2025

(54) METAL OXIDE SEMICONDUCTOR DEVICE AND METHOD FOR MANUFACTURING THE SAME

(71) Applicant: Silicon-Magic Semiconductor Technology (Hangzhou) Co., Ltd., Hangzhou (CN)

(72) Inventors: He Sun, Hangzhou (CN); Jiakun Wang, Hangzhou (CN)

(73) Assignee: Silicon-Magic Semiconductor Technology (Hangzhou) Co., Ltd., Hangzhou (CN)

( * ) Notice: Subject to any disclaimer, the term of this patent is extended or adjusted under 35 U.S.C. 154(b) by 517 days.

(21) Appl. No.: 17/952,778

(22) Filed: Sep. 26, 2022

(65) Prior Publication Data

US 2023/0170401 A1 Jun. 1, 2023

(30) Foreign Application Priority Data

Nov. 29, 2021 (CN) .......................... 202111427488.2

(51) Int. Cl.
| | |
|---|---|
| *H10D 30/66* | (2025.01) |
| *H01L 21/265* | (2006.01) |
| *H01L 21/266* | (2006.01) |
| *H10D 30/01* | (2025.01) |
| *H10D 62/17* | (2025.01) |
| *H10D 64/27* | (2025.01) |

(52) U.S. Cl.
CPC ... *H10D 30/0291* (2025.01); *H01L 21/26513* (2013.01); *H01L 21/266* (2013.01); *H10D 30/66* (2025.01); *H10D 62/314* (2025.01); *H10D 64/516* (2025.01); *H10D 64/519* (2025.01)

(58) Field of Classification Search
CPC .. H10D 30/0291; H10D 30/66; H10D 62/314; H10D 64/516; H10D 64/519; H10D 30/662; H10D 62/127; H10D 62/124; H10D 84/0128; H10D 84/0135; H10D 84/0144; H10D 84/038; H10D 84/83; H10D 62/105; H01L 21/26513; H01L 21/266
See application file for complete search history.

(56) References Cited

U.S. PATENT DOCUMENTS 10,109,625 B2 * 10/2018 Mallikarjunaswamy ................... H10D 84/82

* cited by examiner

*Primary Examiner* — David Vu
(74) *Attorney, Agent, or Firm* — Osha Bergman Watanabe & Burton LLP

(57) ABSTRACT

The present disclosure provides a metal oxide semiconductor device and a method for manufacturing the same. The metal oxide semiconductor device includes a semiconductor substrate, a patterned field oxide layer, first JFET implantation regions and second JFET implantation regions. Active regions and gate regions are formed on an upper surface of the semiconductor substrate, each active region is surrounded by two or more of the gate regions, and the gate regions form a grid and some gate regions overlap to form gate intersections. The first JFET implantation regions are formed by implanting ions underneath the gate intersections of the upper surface of the semiconductor substrate. Orthogonal projections of the first JFET implantation regions and the field oxide layer onto the substrate don't overlap. The second JFET implantation regions are formed by implanting ions into the upper surface of the semiconductor substrate and located underneath the gate regions that are not gate intersections.

9 Claims, 10 Drawing Sheets

METAL OXIDE SEMICONDUCTOR DEVICE AND METHOD FOR MANUFACTURING THE SAME

FIELD OF TECHNOLOGY

The present disclosure relates to a semiconductor device, in particular to a metal oxide semiconductor (MOS) device and method for manufacturing the same for increasing the breakdown voltage.

BACKGROUND

FIG. 1 and FIG. 2 show a structure of a conventional planar MOS device. FIG. 1 is a top view illustrating the cellular structure of the MOS device. FIG. 2 shows the cross-sectional view of the MOS device. In this case no implantation mask is used for junction-gate field-effect transistor (JFET) implantation in the manufacturing process of the MOS device. The JFET region 150 and the semiconductor substrate 130 are of the same dopant type. Meanwhile, the dopant concentration of the JFET region 150 is greater than that of the semiconductor substrate 130.

On the left of FIG. 2 is a cross-section of the MOS device passing through the line A-A' and the gate intersection 123. A gate intersection is where two or more gate regions overlap. On the right of FIG. 2 is a cross-section of the MOS device passing through the line B'-B and the gate region 121. JFET regions 150 are formed by implanting dopant ions to under gate regions 121 and 122. Gate intersections 123 have more dopants implanted underneath, so that the JFET regions 150 under the gate intersections 123 have longer lengths along the diagonals of the gate intersections 123 than lengths of JFET regions 150 under gate regions other than the gate intersections 123. When reverse-biased, depletion layers, formed by PN junctions, at two ends of each of the JFET regions 150 under the gate intersections 123 are unlikely to get in contact with each other and therefore the device has a lowered breakdown voltage along the diagonals, making the planar MOS device unstable, thereby narrowing the device's operating range.

SUMMARY

The present disclosure provides a metal oxide semiconductor device, comprising a semiconductor substrate, comprising active regions and gate regions disposed on an upper surface of the semiconductor substrate, wherein each of the active regions is surrounded by two or more of the gate regions, wherein the gate regions form a grid, comprising a plurality of gate intersections which are formed from intersecting gate regions; a patterned field oxide layer, wherein the patterned field oxide layer is configured to overlap with one of the plurality of gate intersections; wherein the semiconductor substrate further comprises ion-implanted regions, wherein the ion-implanted regions comprise first JFET implantation regions and second JFET implantation regions; wherein each of the first JFET implantation regions is configured to be underneath one of the plurality of gate intersections, wherein an orthogonal projection of each of the first JFET implantation regions and an orthogonal projection of said patterned field oxide layer onto the semiconductor substrate do not overlap; and wherein each of the second JFET implantation regions is configured to be underneath non-intersecting gate regions.

The present disclosure provides a method for manufacturing a metal oxide semiconductor device, comprising: providing a semiconductor substrate, which is of a first dopant type; forming an oxide layer on an upper surface of the semiconductor substrate, and patterning the oxide layer to form a patterned field oxide layer with a photolithography and a first etching process, wherein the patterned field oxide layer serves as an implantation mask to form a ring shaped implantation region, wherein said ring shaped implantation region covers a cell region, wherein the cell region comprises active regions and gate regions, wherein each of the active regions is surrounded by two or more of the gate regions, wherein the gate regions form a grid, comprising a plurality of gate intersections which are formed from intersecting gate regions; performing a drive-in process on the ring shaped implantation region, wherein the patterned field oxide layer has grown larger after the drive-in process; etching the patterned field oxide layer for a second time, wherein the plurality of gate intersections is partially protected in the etching by the patterned field oxide layer, and wherein the gate regions that are not one of the plurality of gate intersections are not protected in the etching and are exposed by the patterned field oxide layer; wherein the plurality of gate intersections forms shapes which surround areas protected by the patterned field oxide layer; and performing JFET implantation for the gate regions and the plurality of gate intersections, using the patterned field oxide layer as another ion implantation mask. followed by a diffusion process, to form first JFET implantation regions configured to be underneath the plurality of gate intersections, and second JFET implantation regions configured to be underneath non-intersecting gate regions; wherein an orthogonal projection of each of the first JFET implantation regions and an orthogonal projection of said patterned field oxide layer onto the semiconductor substrate do not overlap.

DETAILED DESCRIPTION

Figure 1:
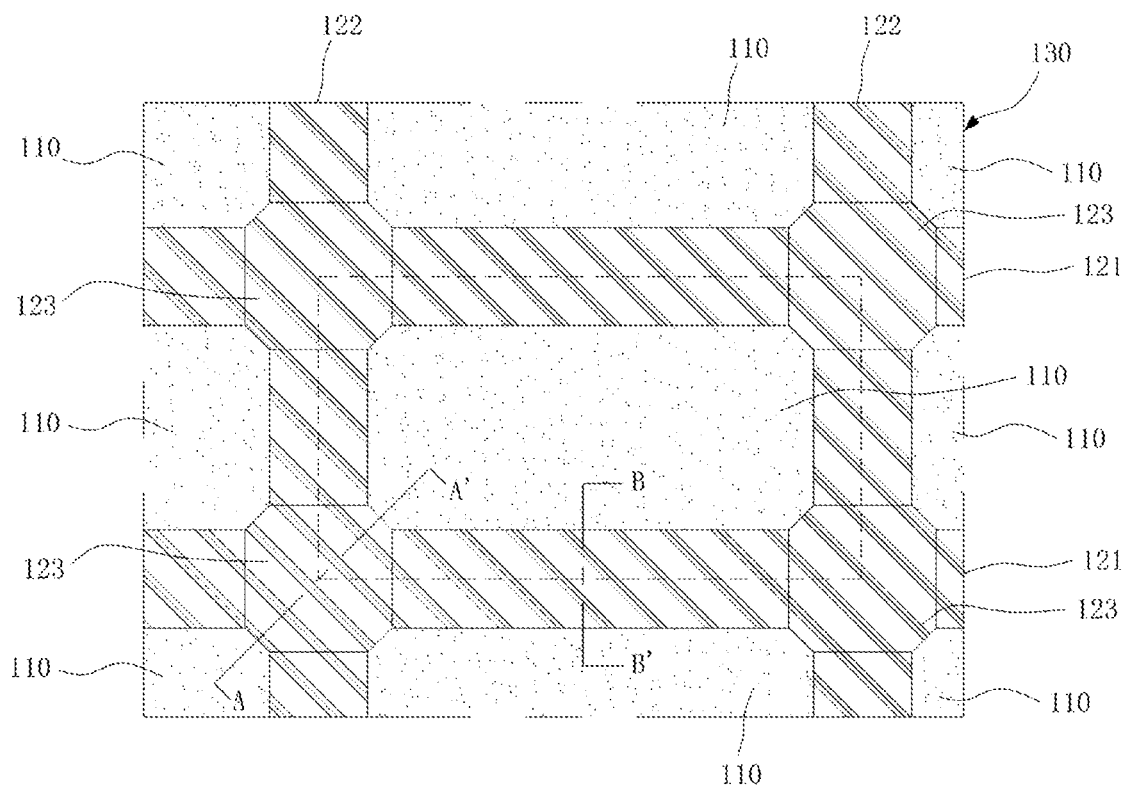
FIG. 1 is a top view of a cellular structure of a conventional planar MOS device.
Figure 2:
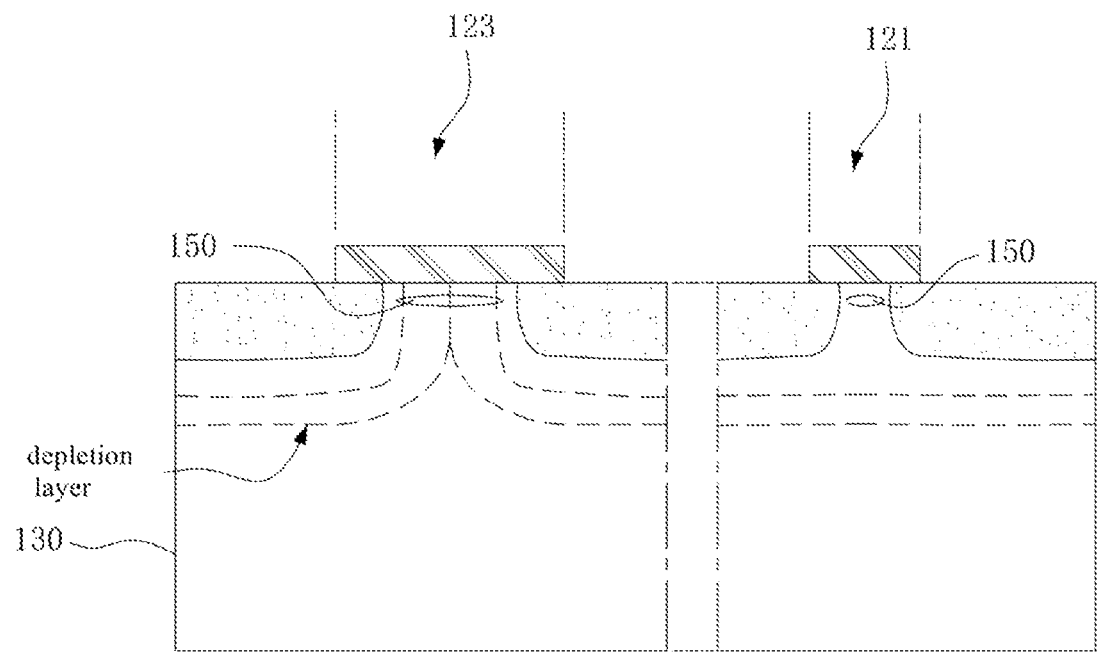
FIG. 2 shows a cross-sectional view of the MOS device passing through the line A-A' in FIG. 1, and a cross-sectional view of the MOS device passing through the line B'-B in FIG. 1.

The present disclosure is described below by specific embodiments, and those skilled in the art can readily understand other advantages and effects of the present disclosure from the content disclosed by the specification herein. The present disclosure may be embodied or applied in various other specific embodiments, and the details of the present disclosure may also be modified or changed based on different perspectives and applications without departing from the spirit and scope of the present disclosure. It should be noted that the embodiments in the present disclosure and the features in the embodiments may be combined with each other if no conflict will result.

Embodiments of the present disclosure are illustrated in each accompanying drawing, wherein like reference numerals refer to same elements throughout. For the sake of clarity, the drawings are not necessarily drawn to scale. Additionally, some well-known parts may be omitted. For the sake of simplicity, among drawings showing various step of the method, a certain one may show an intermediate semiconductor structure obtained after several steps performed on the structure shown in its previous drawing.

It should be understood that when a first element is positioned "above", "over", or "on" a second element, the first element may either be directly on the top of the second element, or there might be additional elements in between the first and the second elements. Moreover, if the device in the figures is turned upside-down, the first element will be "under", "below", or "beneath" the second element In the disclosure, the term "semiconductor structure" is a collective term for all the intermediate semiconductor structures formed as a result of each step of fabricating a semiconductor device, including all the layers or regions formed as of the corresponding step. The term "laterally" means being substantially parallel to the substrate. The term "vertical" means being substantially perpendicular to the substrate.

Figure 3:
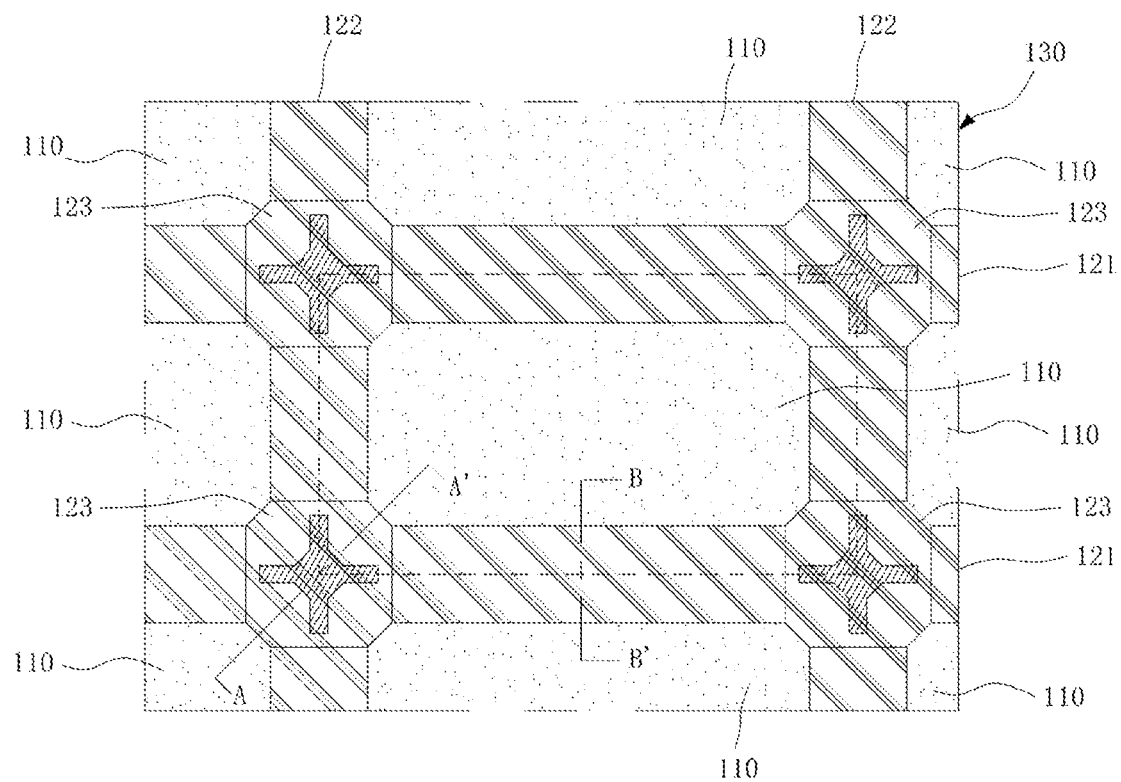
FIG. 3 is a top view of a cellular structure of a MOS device according to an embodiment of the present disclosure.

FIG. 3 is a top view of a cellular structure of a metal oxide semiconductor (MOS) device according to an embodiment of the present disclosure. As shown in FIG. 3, the cellular structure includes an array of regions in shapes of regular polygons. The portion encircled by dashed lines in FIG. 3 represents one cell, and the cellular structure may include multiple cells. The cellular structure includes a plurality of active regions 110 connected in parallel, and a plurality of gate regions 121, 122 distributed around the active regions 110. The plurality of active regions 110 and the plurality of gate regions 121, 122 are disposed on an upper surface of the semiconductor substrate 130. Two or more of the gate regions 121, 122 surround one of the active regions 110. The plurality of gate regions 121, 122 include a first group of gate regions 121 extending in a first direction, and a second group of gate regions 122 extending in a second direction perpendicular to the first direction, and they are connected to form a grid so that active regions 110 can be isolated from each other. Taking the layout shown in FIG. 3 as an example, the first group of gate regions 121 are spaced apart and parallel to each other, the second group of gate regions 122 are spaced apart and parallel to each other, and each of the first group of gate regions 121 overlaps with one or more of the second group of gate regions 122 to form one or more gate intersections 123; two adjacent ones of the first group of the gate regions 121 and two adjacent ones of the second group of gate regions 122 encloses one cell, which is in the shape of a rectangle. In other embodiments, each cell may be in the shape of a square, a hexagon, etc. The shape of the gate intersections 123 in the cellular structure is the same as that of the cells; that is, when the cells are rectangular, the gate intersections 123 are also rectangular, and when the cells are hexagonal, the gate intersections 123 are also hexagonal.

Figure 4:
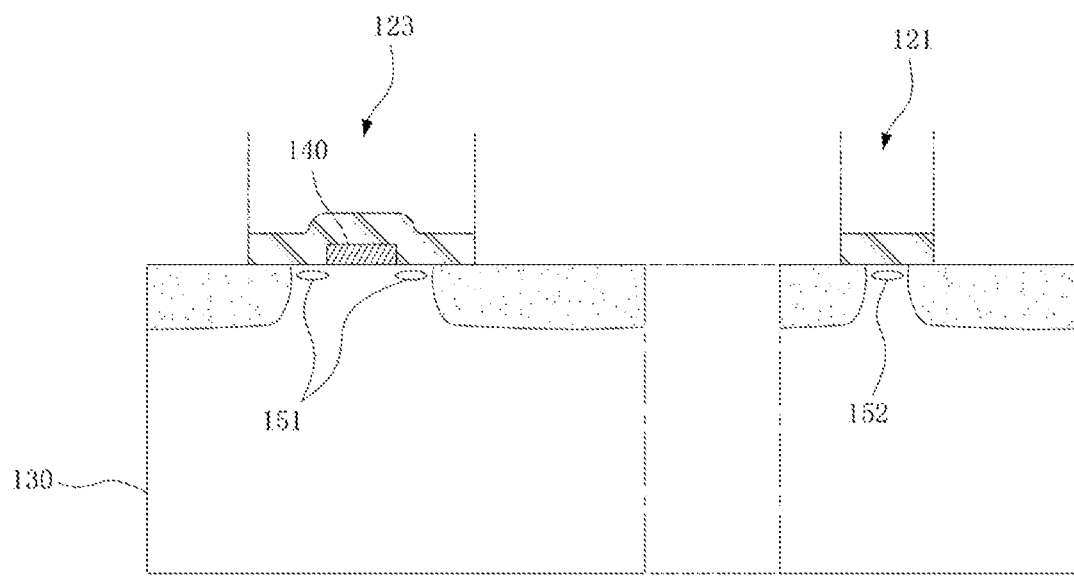
FIG. 4 shows a cross-sectional view of the MOS device along the line A-A' in FIG. 3, and a cross-sectional view of the MOS device along the line B-B' in FIG. 3.

Referring to FIG. 4, on the left of the figure is a cross-sectional view of the MOS device along the line A-A' in FIG. 3, with the line A-A' representing the diagonals of the gate intersections 123; on the right of the figure is a cross-section of the MOS device along the line B-B' in FIG. 3, with line B-B' perpendicular to the direction in which the first group of gate regions 121 extend. As shown in FIG. 4, the MOS device includes a semiconductor substrate 130, and the semiconductor substrate 130 is of a first dopant type. As shown in the FIGS. 3 and 4, the plurality of gate intersections 123 and the plurality of gate regions 121, 122 are located on the upper surface of the semiconductor substrate 130. Each of the active regions 110 includes a source region of a second dopant type and a well region of the second dopant type, and the source region and the well region are adjacent to each other. Each gate intersection 123 and each gate region 121 are respectively located between two adjacent active regions 110; a field oxide layer 140 is formed over each gate intersection 123, and partially covers the corresponding gate intersection 123. Using the patterned field oxide layer 140 as a mask, JFET implantation is performed on the gate intersections 123, so that the JFET implantation does not affect portions of the semiconductor substrate 130 under the field oxide layers 140; as a result, first JFET implantation regions 151 are formed, and are ring-shaped around the field oxide pattern, and a portion of the semiconductor substrate 130 underneath each field oxide layer 140 is surrounded by one of the first implantation regions 151. Orthogonal projections of the first JFET implantation regions 151 and the field oxide layers 140 onto the semiconductor substrate 130 do not overlap. In each gate intersection 123, a gate electrode 150 basically overlays only some portions of the gate intersection 123 outside the field oxide layer 140. On the contrary, no overlay between the gate regions 121, 122 and the field oxide layer, so that second JFET implantation regions 152 overlaps to the entire gate regions 121, 122. Two PN junctions and depletion layers corresponding to the PN junctions are formed between each of the JFET implantation regions 151, 152 and an adjacent region; each two depletion layers are formed on two sides of each JFET implantation region 151, 152, and are formed in pairs in a substantially symmetrical manner.

As shown in FIG. 4, one of the first JFET implantation regions 151 is formed underneath one of the gate intersections 123 and surrounds a non-implanted region, and the non-implanted region is located underneath one of the field oxide layers 140. Although two isolated cross-sections of each first JFET implantation region 151 are shown in FIG. 4, every first JFET implantation region 151 as shown in FIG. 4 is actually of a continuous circular structure. Other structural regions are formed adjacent to each first JFET implantation region 151, and PN junctions and depletion layers corresponding to the PN junctions are also formed between the other structural regions and each first JFET implantation region 151. As shown in the cross sections of FIG. 4, each first JFET implantation region 151 can be seen to include two smaller portions arranged in the lateral direction, so that it is easier for depletion regions at two ends of the corresponding gate intersection 123 to merge, which can increase the breakdown voltage of the device in the A-A' direction and improve the stability of the device.

Figure 5:
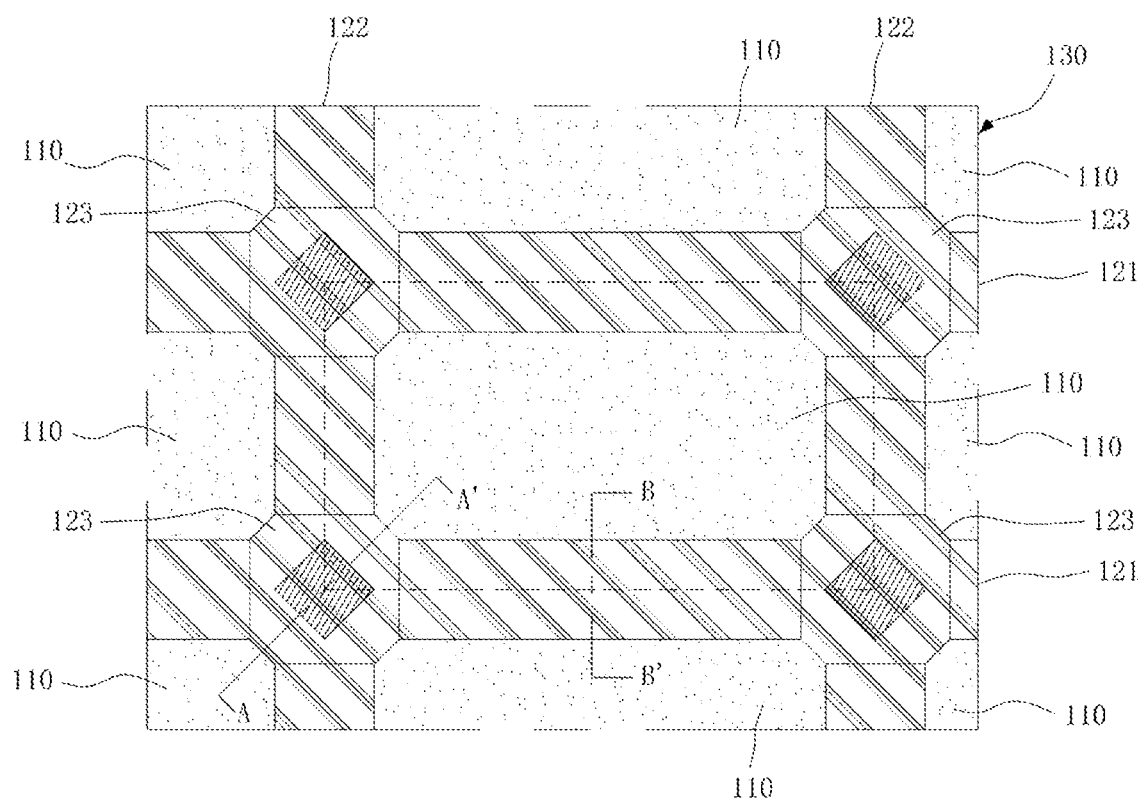
FIG. 5 and FIG. 6 are top views of cell structures of MOS devices according to different embodiments of the present disclosure.
Figure 6:
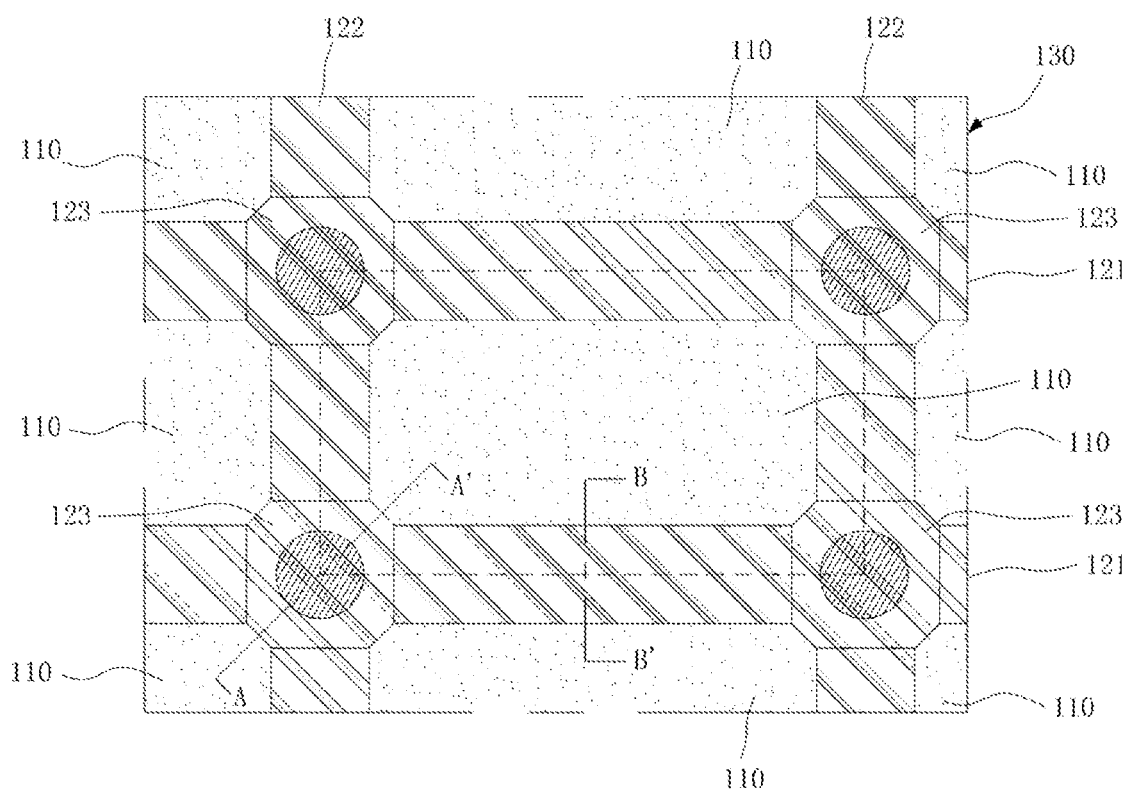

As shown in FIGS. 4, 5 and 6, each field oxide layer 140 partially covers a central region of the corresponding gate intersection 123, while regions of the gate intersection 123 not covered by the field oxide layer 140 substantially surround the field oxide layer 140. The field oxide layers 140 can be polygonal, circular, or of more complex configuration. As shown in FIG. 5, the field oxide layers 140 are substantially squares, and their sides are at an angle of 45 or 135 degrees to the first direction or the second direction.

Nevertheless, laterally or vertically extending blocks may be formed on corners of the squares, so that the field oxide layers 140 have a more complex configuration. The field oxide layers 140 shown in FIG. 5 are in the shape of a square or rectangle. The field oxide layers 140 shown in FIG. 6 are round.

Figure 7A:
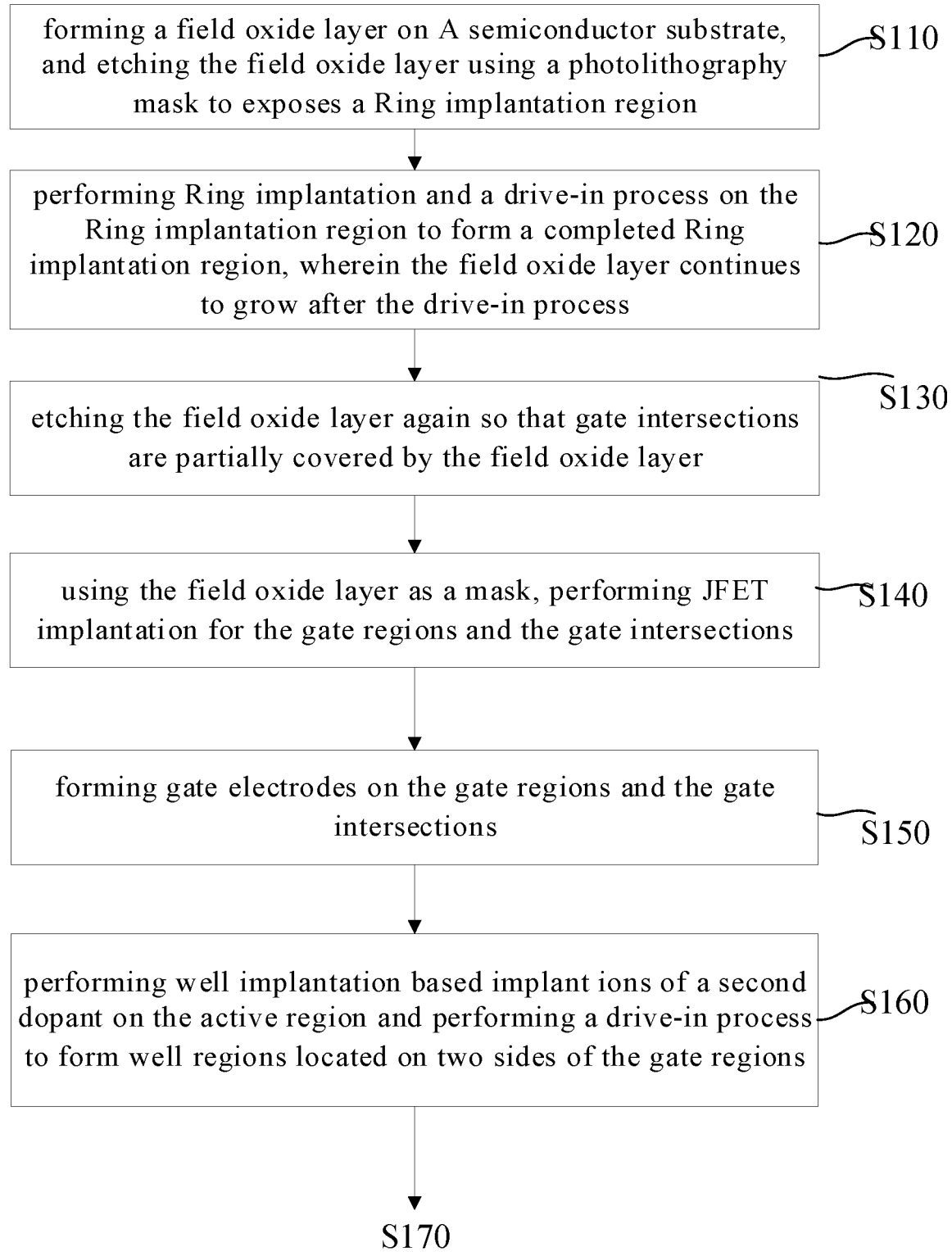
FIG. 7A and FIG. 7B are flowcharts illustrating a method for manufacturing a MOS device according to an embodiment of the present disclosure.
Figure 7B:
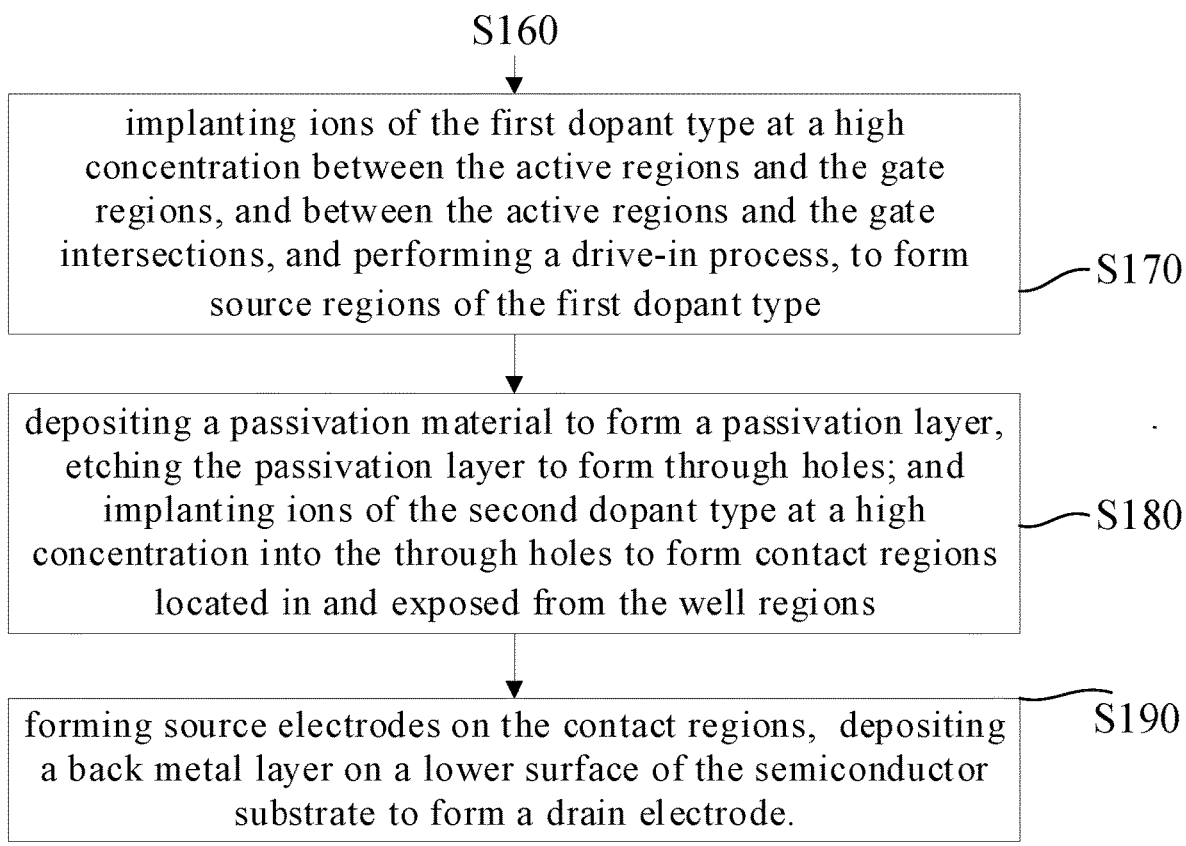

FIG. 7A and FIG. 7B combined are flowcharts illustrating a method for manufacturing a MOS device according to an embodiment of the present disclosure; FIG. 8 to FIG. 15 shows cross-sections of intermediate structures obtained in various steps of the method for the manufacturing the MOS device according to an embodiment of the present disclosure.

Figure 8:
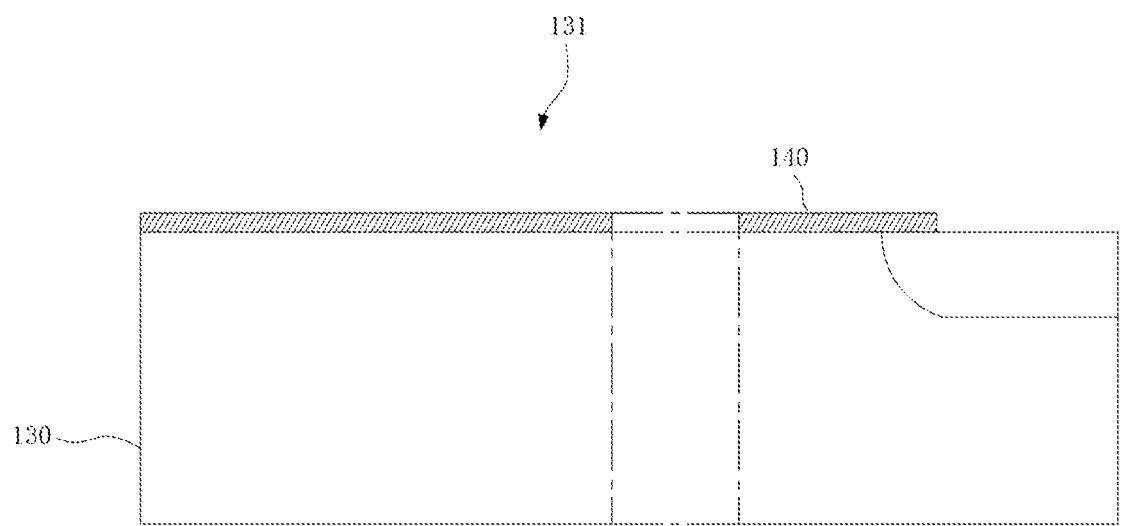
FIG. 8 to FIG. 15 show cross-sections of intermediate structures obtained in various steps of a method for the manufacturing a MOS device according to an embodiment of the present disclosure.
Figure 9:
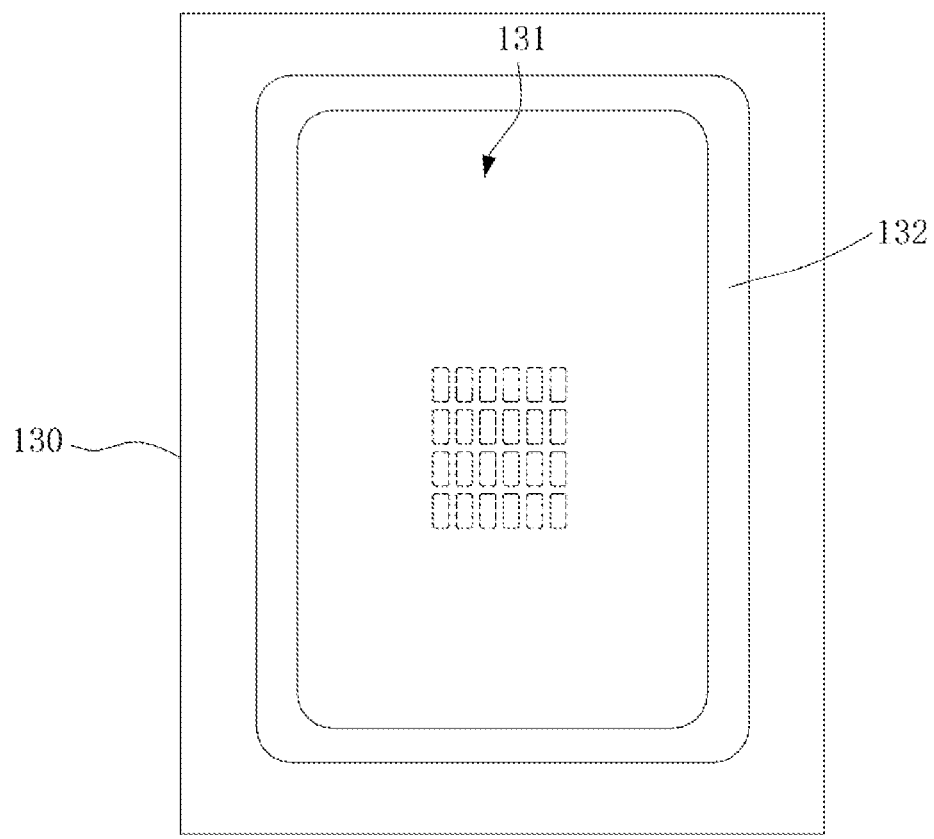

S110: As shown in FIG. 8 and FIG. 9, a semiconductor substrate 130 is first provided, a field oxide layer 140 is then formed on an upper surface of the semiconductor substrate 130, and etched to serve as a first mask, wherein a ring shaped implantation region 132 is exposed by the first mask and a region predetermined to be a cell region 131 is covered by the first mask, as shown in step S110. In one embodiment, the field oxide layer 140 is etched by using a photolithography mask.

S120: Afterwards, Ring implantation and a drive-in process are performed on the ring shaped implantation region 132 to obtain a completed ring shaped implantation region 132, and the field oxide layer 140 continues to grow after the drive-in process, as shown in step S120.

In one embodiment, the semiconductor substrate 130 may include an epitaxial layer formed on a base 133, which is of the first dopant type, in which case the epitaxial layer and the base 133 constitute the semiconductor substrate 130, that is of the first dopant type.

Figure 10:
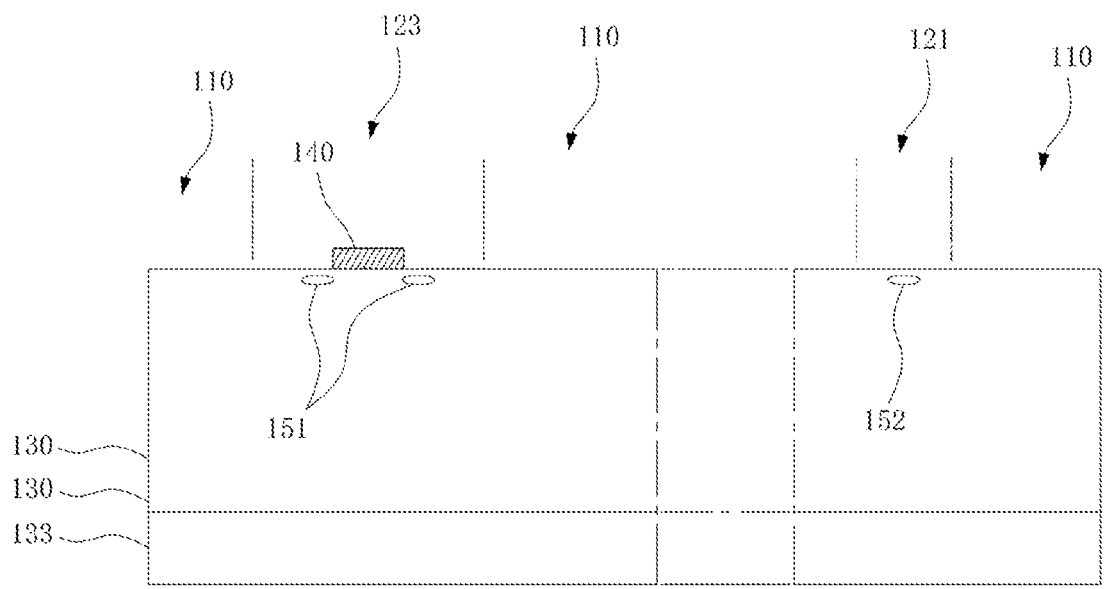

As shown in FIG. 10, the cell region 131 may include a plurality of active regions 110 and a plurality of gate regions 121, 122, wherein each of the active regions 110 is surrounded by two or more gate regions 121, 122. The plurality of gate regions 121, 122 include a first group of gate regions 121 extending in a first direction, and a second group of gate regions 122 extending in a second direction perpendicular to the first direction, and they are connected to form a gate grid so that active regions 110 can be isolated from each other. Each of the first group of gate regions 121 overlaps with one or more of the second group of gate regions 122 to form one or more gate intersections 123.

S130: The field oxide layer 140 formed in S110 is again etched to remove portions over the gate regions 121, 122 and the active regions 110, so that the field oxide layer 140 etched for the second time serves as a second mask, and the gate intersections 123 are partially covered by the etched field oxide layer 140, as shown in step S130. Each field oxide layer 140 obtained in S130 is located around a central position of one of the gate intersections 123.

In one embodiment, the field oxide layer 140 in S110~120 is a unpatterned film layer, which is etched in S130 to obtain patterns of isolated smaller portions, which may also be referred to as field oxide layers when describing relationships between the smaller portions and other regions, like the first JFET implantation regions 151.

S140: As shown in FIG. 10, JFET implantation is performed on the gate regions 121, 122 and the gate intersections 123 by using the field oxide layer 140 as a second mask, as shown in step S140.

Figure 11:
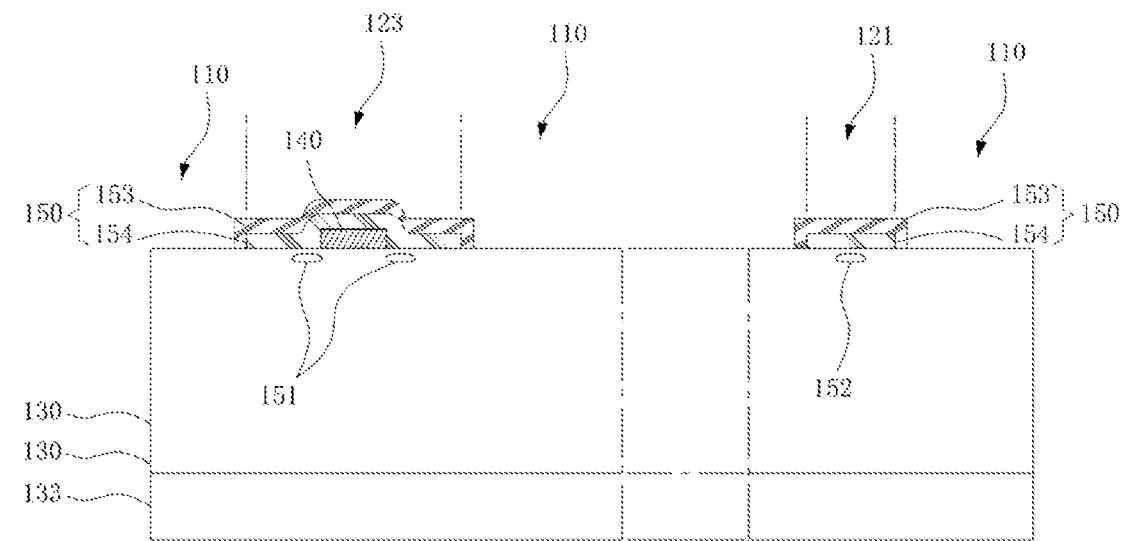

The above JFET implantation treatment includes using the field oxide layer 140 as an implantation mask, implanting ions of the first dopant type into the cell region 131, after which the ions are diffused to form first JFET implantation regions 151 located underneath the gate intersections 123 and second JFET implantation regions 152 located underneath the gate regions 121, 122. The dopant concentration of the JFET implantation regions 151, 152 is greater than the dopant concentration of the semiconductor substrate 130. By using the patterned field oxide layer 140 as an implantation mask, JFET implantation is not performed on portions of the semiconductor substrate 130 underneath the field oxide layers 140, so that each of the first JFET implantation regions 151 surrounds a orthogonal projection orthogonal projection of a corresponding field oxide layer 140 under a corresponding gate intersection 123. That is, orthogonal projections of the first JFET implantation regions 151 and the second mask (i.e., the patterned field oxide layers after the two etching processes) onto the semiconductor substrate do not overlap S150: As shown in FIG. 11, gate dielectric layers 153 are formed above the gate regions 121, 122 and the gate intersections 123, and gate electrode layers 154 are formed on the gate dielectric layers 153 to form gate electrodes 150, as shown in step S150.

As shown in FIG. 11, in each gate intersection 123, other portions of the gate intersection 123 and the field oxide layer 140 are substantially covered by the gate electrode 150. Portions of the gate electrodes 150 corresponding to the field oxide layers 140 protrude upwards. Each gate dielectric layer 153 can include, but is not limited to, an oxide layer, interlayer dielectric materials, or other insulating materials. Each gate electrode layer 154 can include, but is not limited to, polysilicon, metal, or other conductive material. In one embodiment, during the process of forming the gate electrode layers 154, polysilicon is directly deposited on the semiconductor substrate 130, and etched to retain only the polysilicon on the gate dielectric layers 153 as the gate electrode layers 154.

Figure 12:
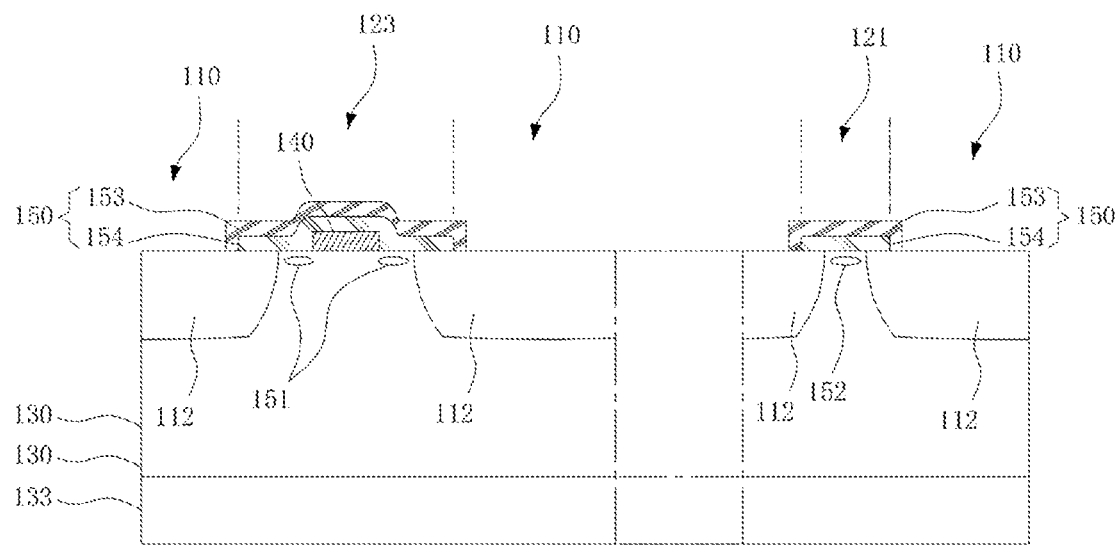

S160: As shown in FIG. 12, after forming the gate electrodes 150, well implantation based on self-alignment and a drive-in process is performed on the active regions 110 to form well regions 112, which are of the second dopant type, and each two of the well regions 112 are located on two sides of one of the gate regions 121, 122, as shown in step S160. When the second dopant type is P, the well regions 112 are P-body, which are part of the structure of the gate regions 121, 122.

Figure 13:
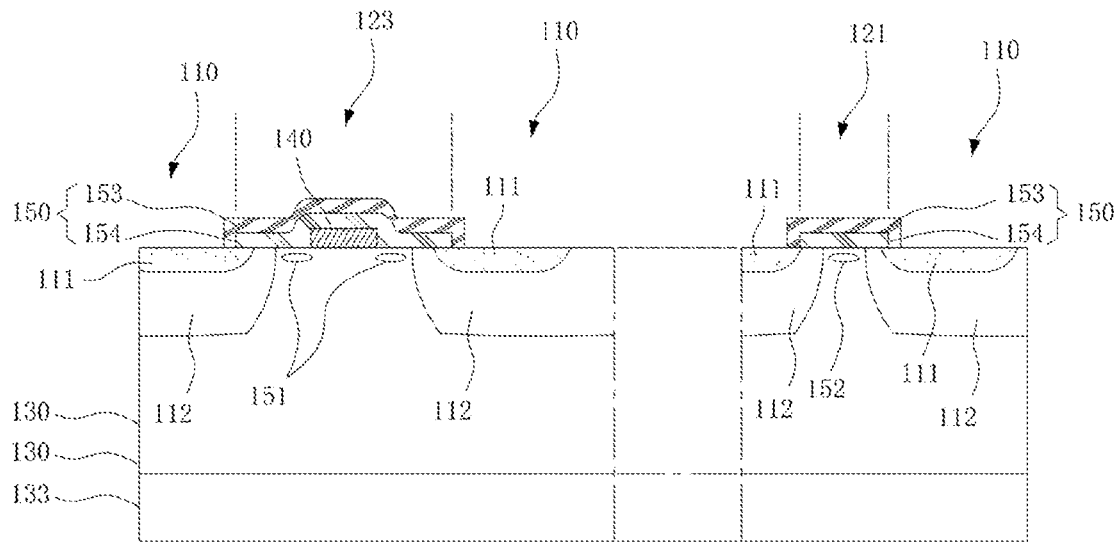

As shown in FIG. 13, ions of the first dopant type (N+, for example) are implanted at a high concentration between the active regions 110 and the gate regions 121, 122, and between the active regions 110 and the gate intersections 123 using a patterned layer as the mask, and a drive-in diffusion process is then performed, forming source regions 111, as shown in step S170.

Figure 14:
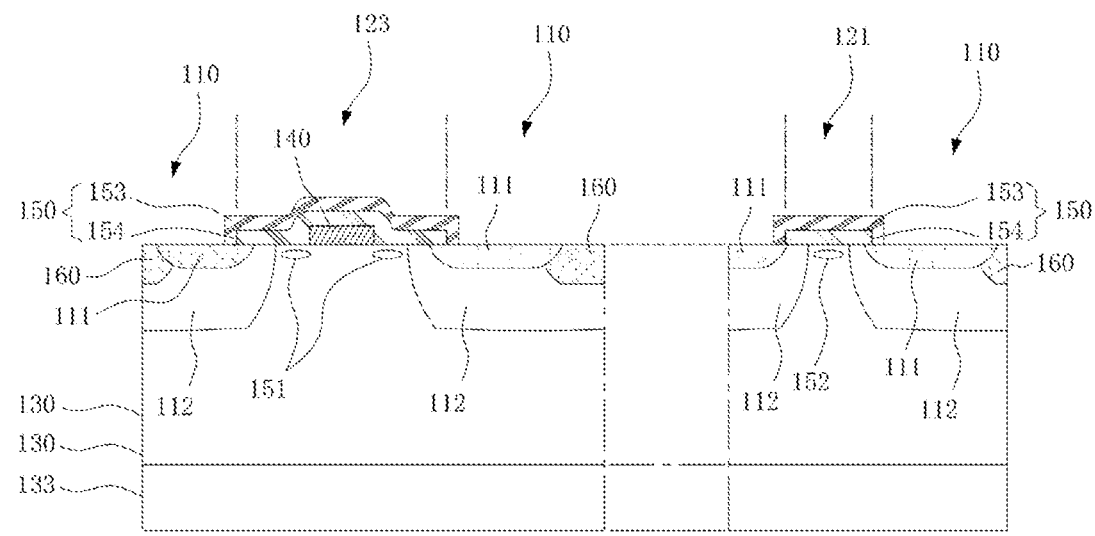

As shown in FIG. 14, a passivation material is deposited on the upper surface of the semiconductor substrate 130 to form a passivation layer, and the passivation layer is etched to form through holes in upper portions of the well regions 112; and ions of the second dopant type (P+, for example) are implanted by using the through holes as a mask at a high concentration to form contact regions 160 located in and exposed from the well regions 112, as shown in step S180.

Figure 15:
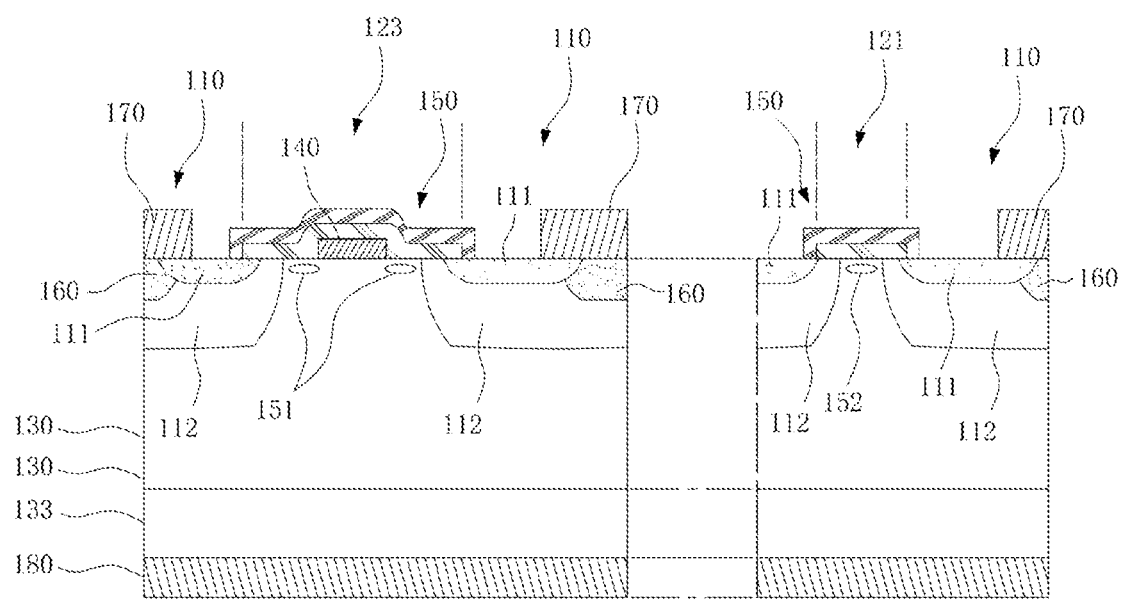

As shown in FIG. 15, after the contact regions 160 are formed, a front metal layer is deposited over the upper surface of the semiconductor substrate 130. The front metal layer is etched to form source electrodes 170 over the contact regions 160, and both the contact regions 160 and the well regions 112 are in contact with lower surfaces of the source electrodes 170, as shown in step S190. At the same time or afterwards, a back metal layer may also be deposited on a lower surface of the semiconductor substrate 130 to form a drain electrode 180.

In the MOS device, each of the first JFET implantation regions 151, formed by using the field oxide layer 140 as a mask, can be deemed to include two smaller portions arranged in the lateral direction, so that it is easier for depletion regions at two ends of the corresponding gate intersection 123 to merge, which can increase the breakdown voltage of the device in the A-A' direction and improve the stability of the device.

Persons skilled in the art should also understand that for clarity of illustration, the elements (such as components, regions, layers, etc.) in each accompanying drawing are not necessarily drawn to scale, and the various elements in the drawings are not necessarily depicted in their actual shapes. Persons skilled in the art should also understand that the shapes depicted are for exemplary purposes. For example, in the above embodiments, regions like the source regions, well regions, and JFET implantation regions are all shown with clear boundaries in the cross sections, which are for illustration purposes only; in actual applications, there may be transition zones between regions that are differently doped, and the corresponding gradients of dopant concentration may be continuous at boundaries between the regions.

The above embodiments merely illustrate the principles and effects of the present disclosure. Anyone skilled in the art can modify or change the above embodiments without departing from the spirit and scope of the present disclosure. Therefore, all equivalent modifications or changes made by those with general knowledge in the technical field without departing from the spirit and technical concept disclosed in the present disclosure should still be covered by the scope of the claims of the present disclosure.

What is claimed is:

1. A metal oxide semiconductor device, comprising:
 a semiconductor substrate, comprising active regions and gate regions disposed on an upper surface of the semiconductor substrate, wherein each of the active regions is surrounded by two or more of the gate regions, wherein the gate regions form a grid, comprising a plurality of gate intersections which are formed from intersecting gate regions;
 a patterned field oxide layer, wherein the patterned field oxide layer is configured to overlap with one of the plurality of gate intersections;
 wherein the semiconductor substrate further comprises ion-implanted regions, wherein the ion-implanted regions comprise first JFET implantation regions and second JFET implantation regions;
 wherein each of the first JFET implantation regions is configured to be underneath one of the plurality of gate intersections, wherein an orthogonal projection of each of the first JFET implantation regions and an orthogonal projection of said patterned field oxide layer onto the semiconductor substrate do not overlap; and
 wherein each of the second JFET implantation regions is configured to be underneath non-intersecting gate regions.

2. The metal oxide semiconductor devices according to claim 1, wherein the patterned field oxide layer is configured to be in a middle position of one of plurality of gate intersections.

3. The metal oxide semiconductor devices according to claim 1, wherein each of a dopant concentration of the first JFET implantation regions and a dopant concentration the second JFET implantation regions is greater than a dopant concentration of the semiconductor substrate.

4. The metal oxide semiconductor devices according to claim 1, further comprising gate electrodes formed over the gate regions and the plurality of gate intersections.

5. The metal oxide semiconductor devices according to claim 4, wherein each of the gate electrodes comprises a gate electrode layer disposed on a gate dielectric layer, and wherein the gate dielectric layer is disposed over one of the gate regions and one of the plurality of gate intersections.

6. The metal oxide semiconductor devices according to claim 4, further comprising source regions and well regions, both are of a second dopant type, wherein two of the well regions are disposed on two sides of one of the gate regions, wherein at least one of the source regions is located between one of the active regions and one of the gate regions, wherein at least one of the source regions is disposed between one of the active regions and one of the plurality of gate intersections, and wherein the source regions are in contact with lower surfaces of the gate electrodes.

7. The metal oxide semiconductor devices according to claim 6, further comprising contact regions, wherein the contact regions are of the second dopant type, wherein the contact regions are disposed in the well regions, and wherein upper surfaces of the contact regions are exposed from the well regions.

8. The metal oxide semiconductor devices according to claim 7, further comprising source electrodes, wherein the source electrodes are disposed on the upper surfaces of the contact regions, and wherein the contact regions and the well regions are both in contact with lower surfaces of the source electrodes.

9. The metal oxide semiconductor devices according to claim 7, further comprising drain electrodes, wherein the drain electrodes are disposed on a lower surface of the semiconductor substrate.

* * * * *